United States Patent
Shi

(10) Patent No.: US 10,614,742 B2
(45) Date of Patent: Apr. 7, 2020

(54) PIXEL STRUCTURE, ARRAY SUBSTRATE, DISPLAY DEVICE AND METHOD FOR DRIVING THE DISPLAY DEVICE

(71) Applicant: BOE TECHNOLOGY GROUP CO., LTD., Beijing (CN)

(72) Inventor: Ge Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/565,783

(22) PCT Filed: Mar. 20, 2017

(86) PCT No.: PCT/CN2017/077297
§ 371 (c)(1),
(2) Date: Oct. 11, 2017

(87) PCT Pub. No.: WO2017/202117
PCT Pub. Date: Nov. 30, 2017

(65) Prior Publication Data
US 2019/0073938 A1 Mar. 7, 2019

(30) Foreign Application Priority Data
May 27, 2016 (CN) .......................... 2016 1 0364255

(51) Int. Cl.
*G09G 3/20* (2006.01)
*G09G 3/3275* (2016.01)
(Continued)

(52) U.S. Cl.
CPC ......... *G09G 3/2074* (2013.01); *G09G 3/3275* (2013.01); *G09G 3/3607* (2013.01);
(Continued)

(58) Field of Classification Search
CPC ....... G09G 2300/0452; G09G 2340/06; G09G 3/2003; G09G 2340/0457; G09G 3/3607;
(Continued)

(56) References Cited

U.S. PATENT DOCUMENTS

| 7,259,755 B1 * | 8/2007 | Ahn ..................... G09G 3/3614 345/204 |
| 2004/0046725 A1 * | 3/2004 | Lee ...................... G09G 3/3607 345/88 |

(Continued)

FOREIGN PATENT DOCUMENTS

| CN | 1722193 A | 1/2006 |
| CN | 1949357 A | 4/2007 |

(Continued)

OTHER PUBLICATIONS

First Office Action for Chinese Application No. 201610364255.5, dated Apr. 4, 2018, 7 Pages.

(Continued)

*Primary Examiner* — Koosha Sharifi-Tafreshi
(74) *Attorney, Agent, or Firm* — Brooks Kushman P.C.

(57) ABSTRACT

A pixel structure, an array substrate, a display device and a method for driving the display device are provided. The pixel structure includes a plurality of pixel units, each including two rows of subpixels, each row of which includes a monochrome subpixel and a white subpixel, the monochrome subpixel being any one selected from a first monochrome subpixel, a second monochrome subpixel and a third monochrome subpixel and colors of two monochrome subpixels in each pixel unit being different, wherein monochrome subpixels in each row or column are arranged periodically in an order of a first, second and third monochrome subpixel, colors of the first monochrome subpixel, the second monochrome subpixel and the third monochrome subpixel are different from each other, and monochromatic (Continued)

light beams emitted by the first monochrome subpixel, the second monochrome subpixel and the third monochrome subpixel are capable of being mixed into white light.

19 Claims, 4 Drawing Sheets

(51) Int. Cl.
*G09G 3/36* (2006.01)
*H01L 27/32* (2006.01)
*G02F 1/1343* (2006.01)

(52) U.S. Cl.
CPC ...... *H01L 27/3213* (2013.01); *H01L 27/3218* (2013.01); *G02F 2001/134345* (2013.01); *G02F 2201/52* (2013.01); *G09G 3/20* (2013.01); *H01L 27/3216* (2013.01)

(58) Field of Classification Search
CPC ............. G09G 2320/0276; G09G 3/20; G09G 2320/0233; G09G 3/3648; G09G 2300/0443; G09G 2300/0842; G09G 3/2074; G09G 3/3233; G09G 5/02; G02F 2201/52; G02F 1/133514
See application file for complete search history.

(56) References Cited

U.S. PATENT DOCUMENTS

| | | |
|---|---|---|
| 2005/0225574 A1 | 10/2005 | Brown Elliott et al. |
| 2005/0225575 A1* | 10/2005 | Brown Elliott ... G02F 1/133514 345/694 |
| 2008/0061305 A1 | 3/2008 | Kim et al. |
| 2013/0106891 A1* | 5/2013 | Matsueda ............ G09G 3/2003 345/589 |
| 2014/0327605 A1* | 11/2014 | Phan ........................ G09G 5/02 345/55 |
| 2016/0216580 A1* | 7/2016 | Ishii ........................ G02B 5/201 |
| 2016/0232862 A1* | 8/2016 | Kim ..................... G09G 3/3614 |
| 2017/0154563 A1* | 6/2017 | Lin ........................... G06F 3/01 |
| 2017/0162140 A1* | 6/2017 | Kim ..................... G09G 3/3614 |

FOREIGN PATENT DOCUMENTS

| | | |
|---|---|---|
| CN | 102622981 A | 8/2012 |
| CN | 103645584 A | 3/2014 |
| CN | 104280938 A | 1/2015 |
| CN | 105096766 A | 11/2015 |
| CN | 105185244 A | 12/2015 |
| CN | 105225612 A | 1/2016 |
| CN | 105511132 A | 4/2016 |
| JP | 2015079225 A | 4/2015 |

OTHER PUBLICATIONS

International Search Report and Written Opinion for Application No. PCT/CN2017/077297, dated Jun. 30, 2017, 9 Pages.
Third Office Action for Chinese Application No. 201610364255.5, dated Apr. 29, 2019, 7 Pages.

* cited by examiner

PIXEL STRUCTURE, ARRAY SUBSTRATE, DISPLAY DEVICE AND METHOD FOR DRIVING THE DISPLAY DEVICE

CROSS-REFERENCE TO RELATED APPLICATIONS

This application is the U.S. national phase of PCT Application No. PCT/CN2017/077297 filed on Mar. 20, 2017, which claims priority to Chinese Patent Application No. 201610364255.5 filed on May 27, 2016, which are incorporated herein by reference in their entireties.

TECHNICAL FIELD

The present disclosure relates to the field of display technology, and more particularly to a pixel structure, an array substrate, a display device and a method for driving the display device.

BACKGROUND

A conventional pixel point includes three subpixels, that is, a red subpixel, a green subpixel and a blue subpixel. According to a conventional pixel arrangement, a large number of subpixels are required to achieve a certain resolution, which adversely affects a light transmittance of a panel. In general, a required brightness is maintained by increasing backlight power, thereby increasing a product cost.

SUMMARY

In view of the above technical problem, an embodiment of the present disclosure provides a pixel structure, an array substrate, a display device and a method for driving the display device to solve the problem that the backlight power needs to be increased to maintain the required brightness in the conventional arrangement of RGB subpixels.

According to one aspect of the embodiment of the present disclosure, there is provided a pixel structure including a plurality of pixel units, each pixel unit including two rows of subpixels, each row of which includes a monochrome subpixel and a white subpixel, the monochrome subpixel being any one selected from a first monochrome subpixel, a second monochrome subpixel and a third monochrome subpixel, and colors of two monochrome subpixels in each pixel unit being different, wherein monochrome subpixels in each row or in each column of the pixel structure are arranged periodically in an order of a first monochrome subpixel, a second monochrome subpixel and a third monochrome subpixel, colors of the first monochrome subpixel, the second monochrome subpixel and the third monochrome subpixel are different from each other, and monochromatic light beams emitted by the first monochrome subpixel, the second monochrome subpixel and the third monochrome subpixel are capable of being mixed into white light.

Optionally, among two adjacent pixel units in a column direction, one pixel unit has white subpixels located at a left side of the monochrome subpixels, and the other pixel unit has white subpixels located at a right side of the monochrome subpixels.

Optionally, white subpixels of each of pixel units in same row are located at a right side or a left side of the respective pixel unit.

Optionally, each row of subpixels corresponds to one gate line, and two data lines are arranged between two adjacent columns of pixel units in a row direction, and are respectively configured to control subpixels in a left column and a right column with respect to the two data lines.

Optionally, a length-width ratio of the monochrome subpixel is 2:1.5.

Optionally, a length-width ratio of the white subpixel is 1:1.5.

Optionally, a width of the monochrome subpixel is the same as that of the white subpixel.

Optionally, any one of the first monochrome subpixel, the second monochrome subpixel and the third monochrome subpixel is a red subpixel, a green subpixel or a blue subpixel.

According to another aspect of the embodiment of the present disclosure, there is further provided an array substrate including any one of the above-mentioned pixel structures.

According to still another aspect of the embodiment of the present disclosure, there is further provided a display device including the above array substrate.

According to yet another aspect of the embodiment of the present disclosure, there is further provided a method for driving the display device including any one of the above-mentioned pixel structures, including: controlling a polarity of one of two adjacent rows of subpixels in the pixel structure to be opposite to that of the other row of subpixels.

Optionally, within an Nth frame, controlling a polarity of a first row of the two adjacent rows of subpixels to be positive, and a polarity of a second row of the two adjacent rows of subpixels to be negative; and within an (N+1)th frame, controlling the polarity of the first row of the two adjacent rows of subpixels to be negative, and the polarity of the second row of the two adjacent rows of subpixels to be positive, wherein N is a positive integer.

Any one of the above technical solutions has the following benefits or advantages. Each pixel unit includes two rows of subpixels, each row of which includes a monochrome subpixel and a white subpixel, monochrome subpixels in each row or in each column of the pixel structure are arranged periodically in an order of a first monochrome subpixel, a second monochrome subpixel and a third monochrome subpixel, colors of the first monochrome subpixel, the second monochrome subpixel and the third monochrome subpixel are different from each other, and monochromatic light beams emitted by the first monochrome subpixel, the second monochrome subpixel and the third monochrome subpixel are capable of being mixed into white light. Therefore, a resolution that is the same as the conventional arrangement of RGB pixels may be achieved with fewer RGB pixels, and a resolving power and a display brightness of an image may be improved by the white subpixel, enabling a RGBW display at a lower cost.

DETAILED DESCRIPTION

Figures 1, 2:
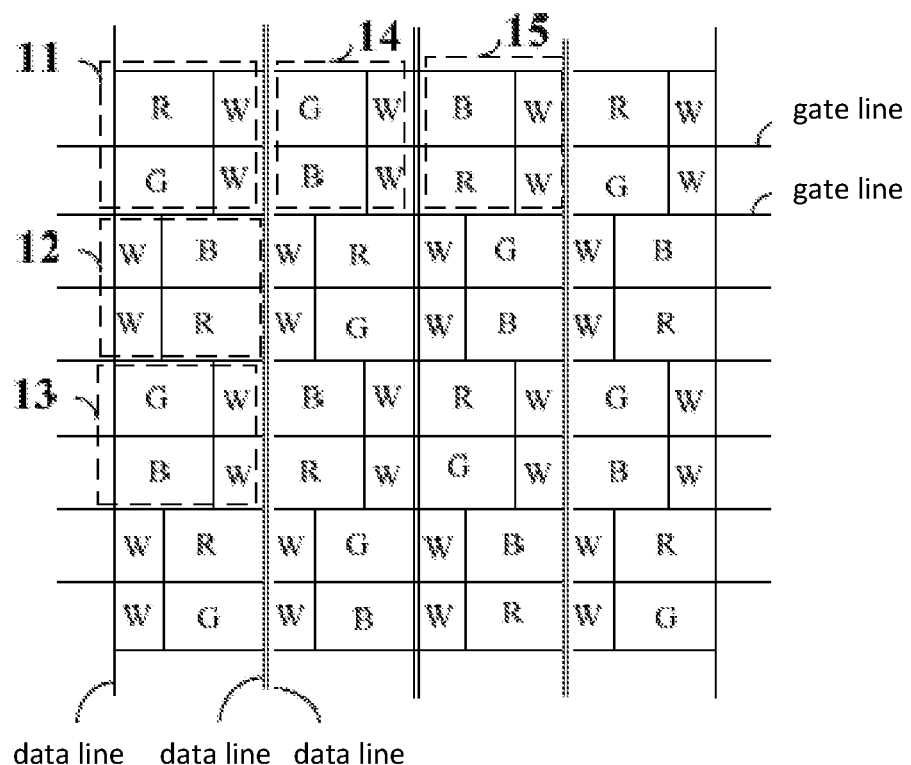
FIG. 1 is a schematic view showing a pixel structure according to some embodiment of the present disclosure.
FIG. 2 is a schematic view showing a pixel unit according to some embodiment of the present disclosure.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art.

The embodiment of the present disclosure provides a pixel structure including a plurality of pixel units, each row of which includes a monochrome subpixel and a white subpixel, the monochrome subpixel being any one selected from a first monochrome subpixel, a second monochrome subpixel and a third monochrome subpixel, and colors of two monochrome subpixels in each pixel unit being different. Monochrome subpixels in each row and/or in each column of the pixel structure are arranged periodically in an order of a first monochrome subpixel, a second monochrome subpixel and a third monochrome subpixel. Colors of the first monochrome subpixel, the second monochrome subpixel and the third monochrome subpixel are different from each other, and monochromatic light beams emitted by the first monochrome subpixel, the second monochrome subpixel and the third monochrome subpixel are capable of being mixed into white light.

In some embodiments of the present disclosure, each pixel unit may includes four subpixels including two white subpixels and two monochrome subpixels. By such an arrangement, not only an effect comparable with a high pixel may be achieved by a low pixel, but also a resolving power of an image may be enhanced by the white (W) subpixel, and power consumption may be reduced. Accordingly, a RGBW display can be realized at a low cost with the arrangement.

Optionally, the plurality of pixel units may be arranged in an array. The plurality of pixel units may be arranged in an array of one row and N1 columns (1×N1), an array of M1 rows and one column (M1×1), or an array of N2 rows and M2 columns (N2×M2), wherein N1, M1, N2 and M2 are integers greater than 1.

Optionally, colors of any two adjacent monochrome subpixels located in a same column of pixel unit(s) are different.

Optionally, among two adjacent pixel units in a column direction, one pixel unit has white subpixels located at a left side of the monochrome subpixels, and the other pixel unit has white subpixels located at a right side of the monochrome subpixels. With such a structure, the brightness may be more uniform and colors may be more balanced in case of displaying the image.

Optionally, each row of subpixels corresponds to one gate line, two data lines are arranged between two adjacent columns of pixel units in a row direction, and are respectively configured to control subpixels in a left column and a right column with respect to the two data lines. With such a structure, a color display image may be realized by controlling a switch and a brightness of each subpixel, and a different color display image may be realized by controlling an area ratio of different subpixels.

FIG. 1 is a schematic view of a pixel structure. Descriptions are made hereinafter by taking a first pixel unit 11, a second pixel unit 12, a third pixel unit 13, a fourth pixel unit 14 and a fifth pixel unit 15 as examples.

The first pixel unit 11 includes two rows of subpixels, a first row of which includes a red subpixel and a white subpixel, and a second row of which includes a green subpixel and a white subpixel.

The second pixel unit 12 includes two rows of subpixels, each row of which includes a white subpixel and a blue subpixel, and a second row of which includes a white subpixel and a red subpixel.

The third pixel unit 13 includes two rows of subpixels, each row of which includes a green subpixel and a white subpixel, and a second row of which includes a blue subpixel and a white subpixel.

Monochromatic light beams emitted by the red subpixel and the green subpixel in the above first pixel unit 11 and the blue subpixel in the above second pixel unit 12 are capable of being mixed into white light. Monochromatic light beams emitted by the red subpixel in the above second pixel unit 12, the green subpixel in the above third pixel unit 13 and the blue subpixel in the above third pixel unit 13 are capable of being mixed into white light.

Still referring to FIG. 1, the fourth pixel unit 14 includes two rows of subpixels, a first row of which includes a green subpixel and a white subpixel, and a second row of which includes a blue subpixel and a white subpixel.

The fifth pixel unit 15 includes two rows of subpixels, a first row of which includes a blue subpixel and a white subpixel, and a second row of which includes a red subpixel and a white subpixel.

Similarly, monochromatic light beams emitted by the red subpixel in the above first pixel unit 11, the green subpixel in the above fourth pixel unit 14 and the blue subpixel in the fifth pixel unit 15 are capable of being mixed into white light. Monochromatic light beams emitted by the green subpixel in the above first pixel unit 11, the blue subpixel in the fourth pixel unit 14 and the red subpixel in the fifth pixel unit 15 are capable of being mixed into white light.

Still referring to FIG. 1, each pixel unit includes two W subpixels and two subpixels (RG subpixels or GB subpixels or BR subpixels). A length-width ratio of each W subpixel is 1:1.5, a length-width ratio of each of the RG subpixels or the GB subpixels or the BR subpixels is 2:1.5, a width of each W subpixel is identical to that of each of the RG subpixels or the GB subpixels or the BR subpixels, and an area ratio between the W subpixel and each of the RG subpixels or the GB subpixels or the BR subpixels is 1:2. It should be understood that, the length-width ratio of the subpixel is not limited in the embodiment of the present disclosure.

In FIG. 1, in each row or each column, the RGB subpixels are arranged periodically according to an order of the R subpixel, the G subpixel, and the B subpixel. In groups of two rows, in two adjacent pixel units in a vertical direction, locations of W subpixels are arranged symmetrically, that is, W subpixels in a single pixel in odd-numbered groups of the pixel array are on a right side of the RG subpixels or the GB subpixels or the BR subpixels of the single pixel, and W subpixels in a single pixel in even-numbered groups of the pixel array are on a left side of the RG subpixels or the GB subpixels or the BR subpixels of the single pixel, an object of such an arrangement is to make the brightness more uniform and the colors more balanced in case of displaying the image.

Optionally, white subpixels in each pixel unit located at a same row are located at an identical side (a right side or a left side) of the pixel unit. For example, as to the first pixel unit 11, the fourth pixel unit 14, the fifth pixel unit 15 located at a same row, the W subpixels are located at the right side of the respective pixel unit.

In the embodiment of the present disclosure, an arrangement of gate lines and data lines of the pixel array is as shown in FIG. 1, where each row of subpixel units corresponds to one gate line, and two data lines are arranged between two adjacent columns of subpixel units, and are respectively configured to control subpixels in a left column and a right column with respect to the two data lines. That is, at the right side of the W subpixels in a single pixel in odd-numbered groups of the pixel array and at the right side of the RG subpixel or the GB subpixels or the BR subpixels in a single pixel in even-numbered groups of the pixel array, one data line is shared to control the subpixels; meanwhile, at the left side of the RG subpixels or the GB subpixels or the BR subpixels in a single pixel in odd-numbered groups of the pixel array and the left side of the W subpixels in a single pixel in even-numbered groups of pixel array, one data line is shared to control the subpixels.

As compared with the conventional RGB and RGBW arrangement, the arrangement according to the embodiment of the present disclosure achieves a same resolution ratio by using fewer R/G/B subpixels, reduces the cost of the design and the production, and at the same time prolongs service life of the subpixel. As compared with an ordinary pentile arrangement, the W subpixel added into the implementing method according to the embodiment of the present disclosure may effectively improve an aliased and blurred image brought by the ordinary pentile arrangement, and may enhance the resolving power of the image. Meanwhile, because of a property of the W subpixel, as compared with the conventional RGB pixel arrangement, the lower backlight brightness is required to achieve the same display brightness thereby further reducing the cost and optimizing the structure design.

Figures 3A, 3B, 4A:
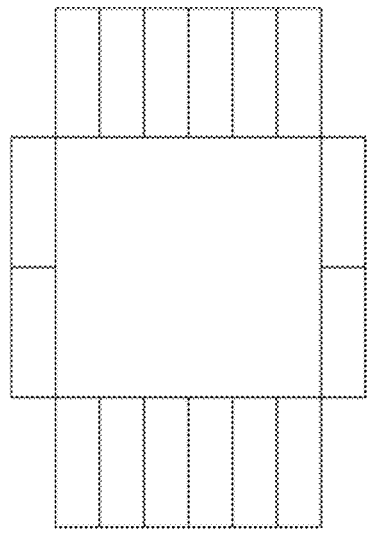
FIG. 3A is a schematic view showing polarities of subpixels within an Nth frame according to some embodiment of the present disclosure.
FIG. 3B is a schematic view showing polarities of subpixels within an N+1th frame according to some embodiment of the present disclosure.
FIG. 4A is a schematic view showing an English letter O to be displayed.

FIG. 2 is a display unit in the pixel arrangement, as shown in FIG. 2, the display unit includes 3*3 pixel units, each pixel unit includes four subpixels. For example, the four subpixels includes two W subpixels and two RG subpixels, or two W subpixels and two GB subpixels, or two subpixels and two BR subpixels. In such a pixel unit, the number of the R subpixels, the G subpixels and the B subpixels are all 6, and according to different signals, a color display image may be realized by controlling a switch and a brightness of each subpixel, and different color display images may be realized by controlling the area ratio of different subpixels. When driving the above pixel array, controlling polarities of two adjacent rows of subpixels to be in an opposite state, Furthermore, a line inversion mode may be adopted for driving the pixel array. For example, in FIG. 3A and FIG. 3B, the line inversion mode is adopted for the pixel array, FIG. 3A is a schematic view showing polarities of subpixels within an Nth frame, and FIG. 3B is a schematic view showing polarities of subpixels within an N+1th frame. In one pixel unit, the number of subpixels in odd-numbered rows is identical to the number of subpixels in even-numbered rows, so adopting the line inversion mode may ensure that the number of subpixels having a positive polarity is identical to the number of subpixels having a negative polarity in the pixel unit. As shown in the figure, within the Nth frame, the subpixels in odd-numbered rows are of a positive polarity, and the subpixels in even-numbered rows are of a negative polarity; and within the N+1th frame, the subpixels in odd-numbered rows are of the negative polarity, and the subpixels in even-numbered rows are of the positive polarity.

Figure 4B:
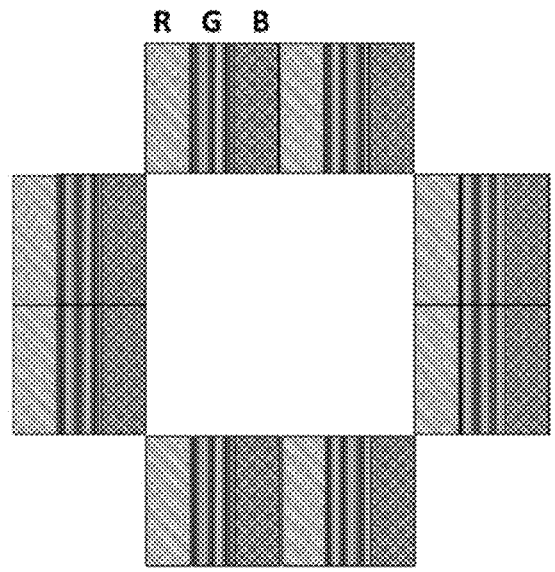
FIG. 4B is a schematic view showing the number of pixels required for displaying the English letter O according to a conventional RGB arrangement.
Figure 4C:
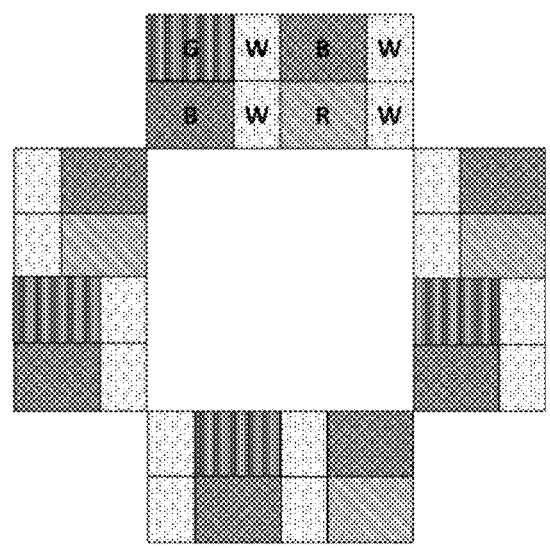
FIG. 4C is a schematic view showing the number of pixels required for displaying the English letter O according to some embodiment of the present disclosure.

Advantages of the implementing method according to the embodiment of the present disclosure as compared with the conventional RGB arrangement are described hereinafter in a detail manner. FIG. 4A is a pattern of an English letter O to be displayed. FIG. 4B is a required quantity of pixels for displaying the letter O according to the conventional RGB arrangement, where in total 24 subpixels are shown, including 8 R subpixels, 8 G subpixels and 8 B subpixels. FIG. 4C is a required quantity of pixels for displaying the letter O according to the embodiment of the present disclosure, where in total 12 subpixels are shown, wherein a quantity of the RGB subpixels is 16. An ideal color-blended pattern may be obtained by controlling gray scales of each color of pixel though the area ratio. The number of the W subpixels is 16, being two thirds of the required quantity of RGB subpixels according to the existing RGB arrangement, moreover, due to filing of the 16 W subpixels, the displayed image is finer, and has a higher brightness under a same circumstance.

Figure 5:
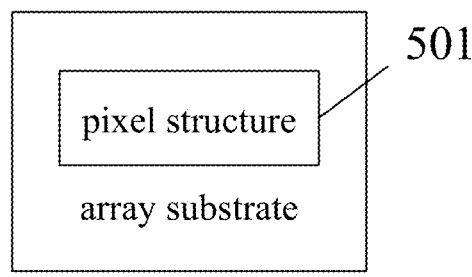
FIG. 5 is a schematic block diagram showing a structure of an array substrate according to some embodiment of the present disclosure.

In another embodiment of the present disclosure, as shown in FIG. 5, there is further provided an array substrate 500 including a pixel structure 501 (any one of the pixel structures as mentioned above), each pixel unit in the pixel structure may includes four subpixels, including two white subpixels and two monochrome subpixels. By such an arrangement, not only an effect comparable with a high pixel may be achieved by a low pixel, but also a resolving power of an image may be enhanced by the white (W) subpixel, and the power consumption may be reduced.

Figure 6:
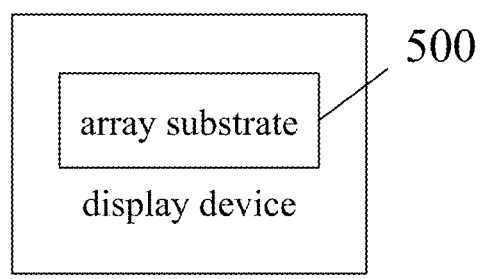
FIG. 6 is a schematic block diagram showing a structure of a display device according to some embodiment of the present disclosure.

In still another embodiment of the present disclosure, as shown in FIG. 6, there is further provided a display device 600, including the above array substrate 500, wherein each pixel unit in the array substrate may includes four subpixels, including two white subpixels and two monochrome subpixels. By such an arrangement, not only an effect comparable with a high pixel may be achieved by a low pixel, but also a resolving power of an image may be enhanced by the white (W) subpixel, and the power consumption may be reduced.

In yet another embodiment of the present disclosure, there is further provided a method for driving a display device including the above pixel structure, including: within an Nth frame, controlling a polarity of a first row of the two adjacent rows of subpixels to be positive, and a polarity of a second row of the two adjacent rows of subpixels to be negative; and within an N+1th frame, controlling the polarity of the first row of the two adjacent rows of subpixels to be negative, and the polarity of the second row of the two adjacent rows of subpixels to be positive, wherein N is a positive integer, where N is a positive integer. By such an arrangement, not only an effect comparable with a high pixel may be achieved by a low pixel, but also a resolving power of an image may be enhanced by the white (W) subpixel, and the power consumption may be reduced. Accordingly, a RGBW display can be realized at a low cost with the arrangement.

It should be understood that, reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner in one or more embodiments.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A pixel structure comprising: a plurality of pixel units, each pixel unit comprising two rows of subpixels, each row of which comprises a monochrome subpixel and a white subpixel, the monochrome subpixel being any one selected from a first monochrome subpixel, a second monochrome subpixel and a third monochrome subpixel, and colors of two monochrome subpixels in each pixel unit being different,
   wherein monochrome subpixels in each row or in each column of the pixel structure include subpixels that are arranged periodically in an order of a first monochrome subpixel, a second monochrome subpixel and a third monochrome subpixel, colors of the first monochrome subpixel, the second monochrome subpixel and the third monochrome subpixel are different from each other, and monochromatic light beams emitted by the first monochrome subpixel, the second monochrome subpixel and the third monochrome subpixel are capable of being mixed into white light;
   among white subpixels in an identical column, there are two monochrome subpixels of different colors between one pair of white subpixels adjacent in a column direction and adjacent another pair of white subpixels adjacent in the column direction.

2. The pixel structure according to claim 1, wherein among two adjacent pixel units in the column direction, one pixel unit has white subpixels located at a left side of the monochrome subpixels, and the other pixel unit has white subpixels located at a right side of the monochrome subpixels.

3. The pixel structure according to claim 1, wherein white subpixels of each of pixel units in same row are located at a right side or a left side of the respective pixel unit.

4. The pixel structure according to claim 1, wherein each row of subpixels corresponds to one gate line, and two data lines are arranged between two adjacent columns of pixel units in a row direction, and are respectively configured to control subpixels in a left column and a right column with respect to the two data lines.

5. The pixel structure according to claim 1, wherein a length-width ratio of the monochrome subpixel is 2:1.5.

6. The pixel structure according to claim 1, wherein a length-width ratio of the white subpixel is 1:1.5.

7. The pixel structure according to claim 1, wherein a width of the monochrome subpixel is the same as that of the white subpixel.

8. The pixel structure according to claim 1, wherein any one of the first monochrome subpixel, the second monochrome subpixel and the third monochrome subpixel is a red subpixel, a green subpixel or a blue subpixel.

9. An array substrate comprising the pixel structure according to claim 1.

10. A display device comprising the array substrate according to claim 9.

11. The pixel structure according to claim 2, wherein white subpixels of each of pixel units in same row are located at a right side or a left side of the respective pixel unit.

12. The pixel structure according to claim 11, wherein each row of subpixels corresponds to one gate line, and two data lines are arranged between two adjacent columns of pixel units in a row direction, and are respectively configured to control subpixels in a left column and a right column with respect to the two data lines.

13. The pixel structure according to claim 12, wherein a length-width ratio of the monochrome subpixel is 2:1.5.

14. The pixel structure according to claim 13, wherein a length-width ratio of the white subpixel is 1:1.5.

15. The pixel structure according to claim 14, wherein a width of the monochrome subpixel is the same as that of the white subpixel.

16. The pixel structure according to claim 1, wherein among the white subpixels in the identical column, the two monochrome subpixels of different colors between one pair of white subpixels adjacent in the column direction and adjacent another pair of white subpixels adjacent in the column direction, are stacked on each other in the column direction.

17. The pixel structure according to claim 16, wherein there are four pairs of white subpixels around and adjacent the two monochrome subpixels of different colors between one pair of white subpixels adjacent in the column direction and adjacent another pair of white subpixels adjacent in the column direction.

18. A method for driving a display device, wherein the display device includes a pixel structure that includes: a plurality of pixel units, each pixel unit including two rows of subpixels, each row of which includes a monochrome subpixel and a white subpixel, the monochrome subpixel being any one selected from a first monochrome subpixel, a second monochrome subpixel and a third monochrome subpixel, and colors of two monochrome subpixels in each pixel unit being different; wherein monochrome subpixels in each row or in each column of the pixel structure include subpixels that are arranged periodically in an order of a first monochrome subpixel, a second monochrome subpixel and a third monochrome subpixel, colors of the first monochrome subpixel, the second monochrome subpixel and the third monochrome subpixel are different from each other, and monochromatic light beams emitted by the first monochrome subpixel, the second monochrome subpixel and the third monochrome subpixel are capable of being mixed into white light among white subpixels in an identical column, there are two monochrome subpixels of different colors between one pair of white subpixels adjacent in a column direction and adjacent another pair of white subpixels adjacent in the column direction;
   wherein the method includes:
      controlling a polarity of one of two adjacent rows of subpixels in the pixel structure to be opposite to that of the other row of subpixels.

19. The method according to claim 18, wherein the controlling a polarity of one of two adjacent rows of subpixels in the pixel structure to be opposite to that of the other row of subpixels comprises:
      within an Nth frame, controlling a polarity of a first row of the two adjacent rows of subpixels to be positive, and a polarity of a second row of the two adjacent rows of subpixels to be negative; and within an (N+1)th frame, controlling the polarity of the first row of the two adjacent rows of subpixels to be negative, and the polarity of the second row of the two adjacent rows of subpixels to be positive, wherein N is a positive integer.

* * * * *